United States Patent
Lin

(10) Patent No.: US 12,014,868 B2
(45) Date of Patent: Jun. 18, 2024

(54) ELECTRODE STRUCTURE

(71) Applicant: CYNTEC CO., LTD., Hsinchu (TW)

(72) Inventor: Yi-Cheng Lin, Pingtung County (TW)

(73) Assignee: CYNTEC CO., LTD., Hsinchu (TW)

( * ) Notice: Subject to any disclaimer, the term of this patent is extended or adjusted under 35 U.S.C. 154(b) by 700 days.

(21) Appl. No.: 17/165,933

(22) Filed: Feb. 2, 2021

(65) Prior Publication Data
US 2022/0052424 A1 Feb. 17, 2022

Related U.S. Application Data

(60) Provisional application No. 63/065,496, filed on Aug. 14, 2020.

(51) Int. Cl.
| | |
|---|---|
| H05K 1/09 | (2006.01) |
| H01F 27/255 | (2006.01) |
| H01F 41/02 | (2006.01) |
| H05K 1/11 | (2006.01) |
| H05K 1/18 | (2006.01) |
| H05K 3/34 | (2006.01) |
| H05K 3/40 | (2006.01) |
| H01F 1/22 | (2006.01) |

(52) U.S. Cl.
CPC ....... *H01F 41/0233* (2013.01); *H01F 27/255* (2013.01); *H01F 41/0246* (2013.01); *H05K 1/09* (2013.01); *H05K 1/111* (2013.01); *H05K 1/18* (2013.01); *H05K 3/341* (2013.01); *H05K 3/40* (2013.01); *H01F 1/22* (2013.01); *H05K 2201/09009* (2013.01); *H05K 2201/10007* (2013.01)

(58) Field of Classification Search
CPC .... H05K 1/09; H05K 1/111; H05K 1/18–185; H05K 2201/09009; H05K 2201/10007; H05K 2201/1053; H05K 2201/10515; H05K 2201/1056; H05K 2201/10537; H05K 2201/10606; H05K 2201/10037
See application file for complete search history.

(56) References Cited

U.S. PATENT DOCUMENTS

| | | | | |
|---|---|---|---|---|
| 6,110,608 A | * | 8/2000 | Tanimoto | H01L 23/49582 257/772 |
| 2002/0004163 A1 | * | 1/2002 | Matsuura | H05K 1/181 429/96 |
| 2004/0160752 A1 | * | 8/2004 | Yamashita | H05K 1/186 361/766 |
| 2004/0224224 A1 | * | 11/2004 | Watanabe | H01M 10/425 429/178 |
| 2009/0268423 A1 | * | 10/2009 | Sakurai | H05K 1/144 361/803 |
| 2016/0021748 A1 | * | 1/2016 | Kageyama | H05K 1/181 361/767 |

* cited by examiner

*Primary Examiner* — Roshn K Varghese
(74) *Attorney, Agent, or Firm* — Min-Lee Teng

(57) ABSTRACT

An electrode structure on a circuit board, the electrode structure comprising a metal structure disposed on and electrically connected to the circuit board, wherein the metal structure and a surface of the circuit board forms a space therebetween, wherein at least one first electrical component is disposed in the space and an outer surface of the metal structure forms an electrode for electrically connecting with an external component.

19 Claims, 5 Drawing Sheets

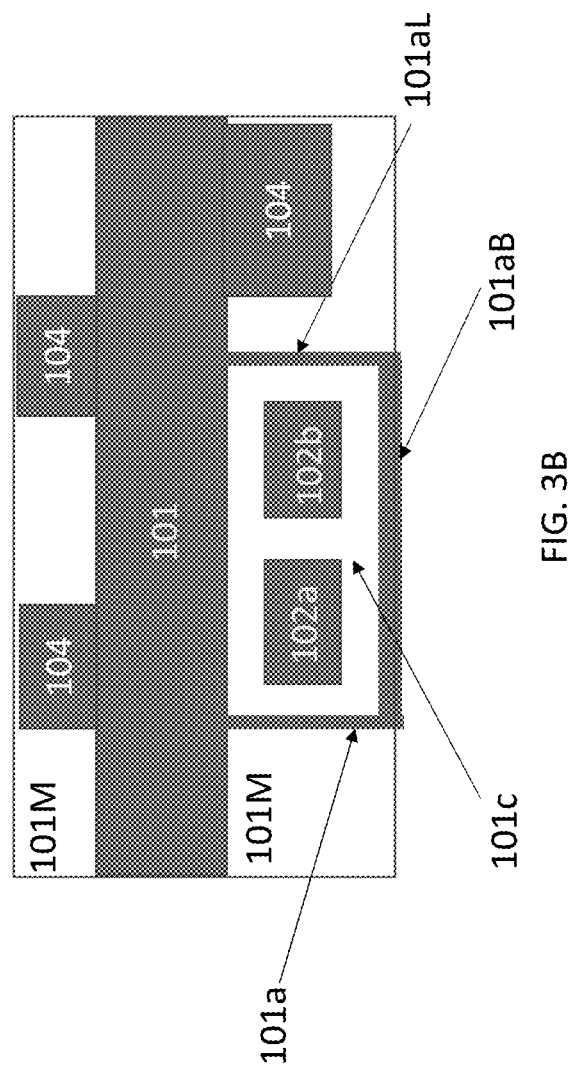

ELECTRODE STRUCTURE

CROSS-REFERENCE TO RELATED APPLICATION

The present application claims the benefit of U.S. Provisional Application Ser. No. 63/065,496 filed on Aug. 14, 2020, which is hereby incorporated by reference herein and made a part of the specification.

BACKGROUND OF THE INVENTION

I. Field of the Invention

The invention relates to an electrode structure, and in particular, to an electrode structure for connecting with a battery.

II. Description of the Related Art

Conventional circuit board mounted on a battery has a very thick electrode on the circuit board to reduce the influence of residual heat during spot-welding. However, the very thick electrode takes a larger PCB space and also can cause the distance between the electrode and the electrical component larger.

Accordingly, there is demand for a better solution to solve these problems.

SUMMARY OF THE INVENTION

One objective is to provide an electrode structure on a circuit board for reducing the influence of residual heat during spot-welding One objective is to provide an electrode structure on a circuit board for reducing the distance between the electrode and the electrical components on the circuit.

One objective is to provide an electrode structure on a circuit board for reducing the size of the circuit board.

In one embodiment, an electrical component is disclosed, wherein the electrical component comprises: An electrode structure on a circuit board, said electrode structure comprising a first metal structure disposed on and electrically connected to the circuit board, wherein the first metal structure and a first surface of the circuit board forms a first space therebetween, wherein at least one first electrical component is disposed in said first space and an outer surface of the first metal structure forms a first electrode for electrically connecting with an external component.

In one embodiment, the external component is a battery and the first electrode is electrically connected to a positive or a negative electrode of the battery.

In one embodiment, the external component is a PCB.

In one embodiment, the metal structure has a U shape.

In one embodiment, the metal structure has a L shape.

In one embodiment, the metal structure comprises copper.

In one embodiment, the metal structure comprises a copper layer and a tin layer overlaid on the copper layer.

In one embodiment, the metal structure and a bottom surface of the circuit board forms a space therebetween, wherein at least one electrical component is disposed in said space and a bottom surface of the metal structure forms an electrode for electrically connecting with an external component.

In one embodiment, the metal structure and a top surface of the circuit board forms a space therebetween, wherein at least one electrical component is disposed in said space and a top surface of the metal structure forms an electrode for electrically connecting with an external component.

In one embodiment, the metal structure is soldered to the circuit board.

In one embodiment, the at least one electrical component comprises a passive device.

In one embodiment, the at least one electrical component comprises at least one of the following: a resistor, a capacitor and an inductor.

In one embodiment, the at least one electrical component comprises an active device.

In one embodiment, the at least one electrical component comprises an IC.

In one embodiment, the at least one electrical component comprises an active device and a passive device.

In one embodiment, the electrode structure further comprises a second metal structure disposed on and electrically connected to the circuit board, wherein the second metal structure and a second surface of the circuit board forms a second space therebetween, wherein at least one second electrical component is disposed in said second space and an outer surface of the second metal structure forms a second electrode for electrically connecting with an external component.

In one embodiment, the external component is a battery and the first electrode and the second electrode are electrically connected to a positive electrode and a negative electrode of the battery, respectively.

In one embodiment, the first electrode has a first surface-mounted pad.

In one embodiment, the first electrode has a first surface-mounted pad and the second electrode has a second surface-mounted pad.

In one embodiment, lateral surfaces of the first metal structure comprises a closed metal path.

In one embodiment, lateral surfaces of the second metal structure comprises a closed metal path.

BRIEF DESCRIPTION OF THE DRAWINGS

The present invention can be more fully understood by reading the subsequent description and examples with references made to the accompanying drawings, wherein:

FIG. 3B illustrates a side view of a packaging structure with a molding body according to one embodiment of present invention.

DETAILED DESCRIPTION OF THE INVENTION

Figure 1A:
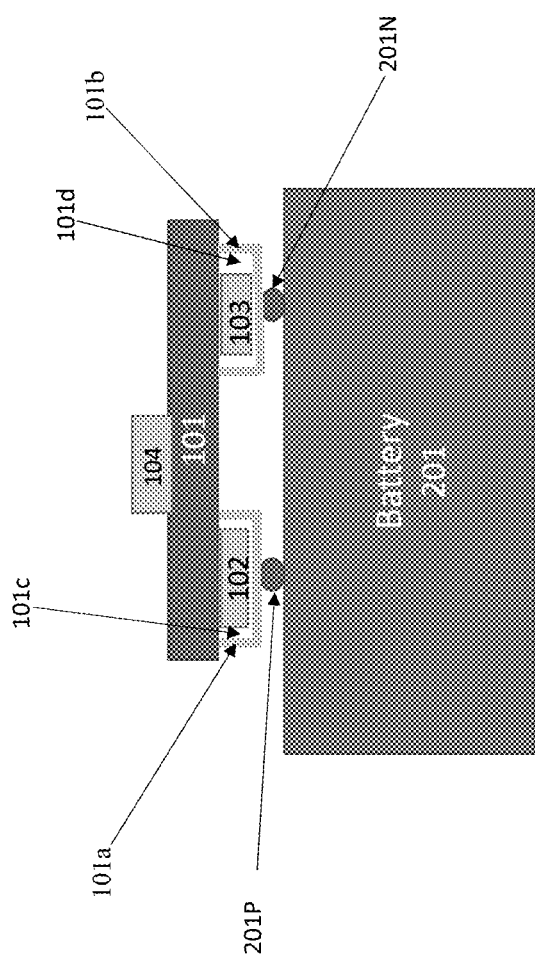
FIG. 1A illustrates a side view of a packaging structure according to one embodiment of present invention.

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1A illustrates a side view of a packaging structure, wherein an electrode structure comprises a first metal structure 101a disposed on and electrically connected to the circuit board 101, wherein the first metal structure 101a and a first surface of the circuit board 101 forms a first space 101c therebetween, wherein at least one first electrical component 102 is disposed in said first space 101c and an outer surface of the first metal structure 101a forms a first electrode for electrically connecting with an external component.

In one embodiment the external component is a battery 201, wherein the first metal structure 101a is electrically connected to a positive electrode 201P of the battery 201.

In one embodiment the external component is a battery 201, wherein the first metal structure 101a is electrically connected to a negative electrode 201N of the battery 201.

In one embodiment, as shown in FIG. 1A, at least one electrical component 104 is disposed on the circuit board.

In one embodiment, the first surface of the circuit board 101 is a bottom surface of the circuit board.

In one embodiment, the first surface of the circuit board 101 is a top surface of the circuit board.

In one embodiment, the external component is a PCB.

In one embodiment, the metal structure has a U shape.

In one embodiment, the metal structure has a L shape.

In one embodiment, the first metal structure 101a comprises copper.

In one embodiment, the first metal structure 101a is made of copper.

In one embodiment, the first metal structure 101a comprises a copper layer and a tin layer overlaid on the copper layer.

In one embodiment, the first metal structure 101a comprises copper, nickel and aluminum.

In one embodiment, the first metal structure 101a comprises a copper layer and a nickel layer overlaid on the copper layer.

In one embodiment, the first metal structure 101a comprises a copper layer, a nickel layer overlaid on the copper layer and an aluminum layer overlaid on the nickel layer.

In one embodiment, the first metal structure 101a comprises a copper layer, a nickel layer overlaid on the copper layer, an aluminum layer overlaid on the nickel layer and a gold layer overlaid on the aluminum layer.

In one embodiment, the first metal structure 101a and a bottom surface of the circuit board 101 forms a space therebetween, wherein at least one electrical component is disposed in said space, and a bottom surface of the metal structure forms an electrode for electrically connecting with an external component.

In one embodiment, the first metal structure 101a and a top surface of the circuit board 101 forms a space therebetween, wherein at least one electrical component is disposed in said space and a top surface of the metal structure forms an electrode for electrically connecting with an external component.

In one embodiment, the first metal structure 101a is soldered to the circuit board.

In one embodiment, the at least one electrical component comprises a passive device.

In one embodiment, the at least one electrical component comprises at least one of the following: a resistor, a capacitor and an inductor.

In one embodiment, the at least one electrical component comprises an active device.

In one embodiment, the at least one electrical component comprises an IC.

In one embodiment, the at least one electrical component comprises an active device and a passive device.

In one embodiment, as shown in FIG. 1A, the electrode structure further comprises a second metal structure 101b disposed on and electrically connected to the circuit board 101, wherein the second metal structure 101b and a second surface of the circuit board forms a second space 101d therebetween, wherein at least one second electrical component 103 is disposed in said second space 101d and an outer surface of the second metal structure 101b forms a second electrode for electrically connecting with the external component.

In one embodiment, as shown in FIG. 1A, the external component is a battery 201 and the first metal structure 101a and the second metal structure 101b are electrically connected to a positive electrode 201P and a negative electrode 201N of the battery 201, respectively.

Figure 1B:
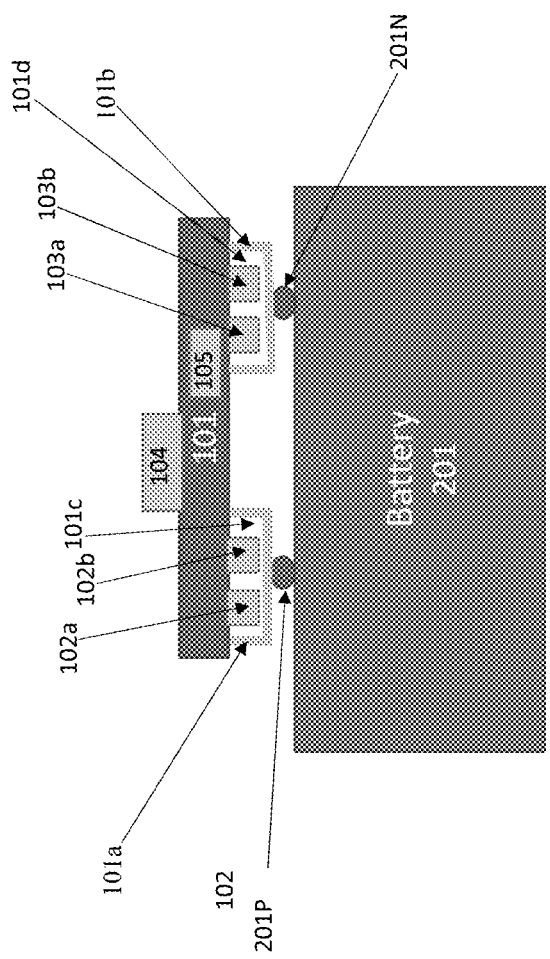
FIG. 1B illustrates a side view of a packaging structure according to one embodiment of present invention.

In one embodiment, as shown in FIG. 1B, at least one electrical component 105 is embedded in the circuit board.

In one embodiment, as shown in FIG. 1B, wherein a plurality of electrical components 102a, 102b are disposed in the first space 101c.

In one embodiment, as shown in FIG. 1B, wherein a plurality of electrical components 103a, 103b are disposed in the second space 101d.

In one embodiment, at least one IC is embedded in the circuit board 101.

In one embodiment, at least one of the following electrical components is disposed on the circuit board: a driver IC, a control IC, a MOSFET, an IGBT and a Diode.

In one embodiment, at least one active device and at least one passive device are embedded in the circuit board.

Figure 2:
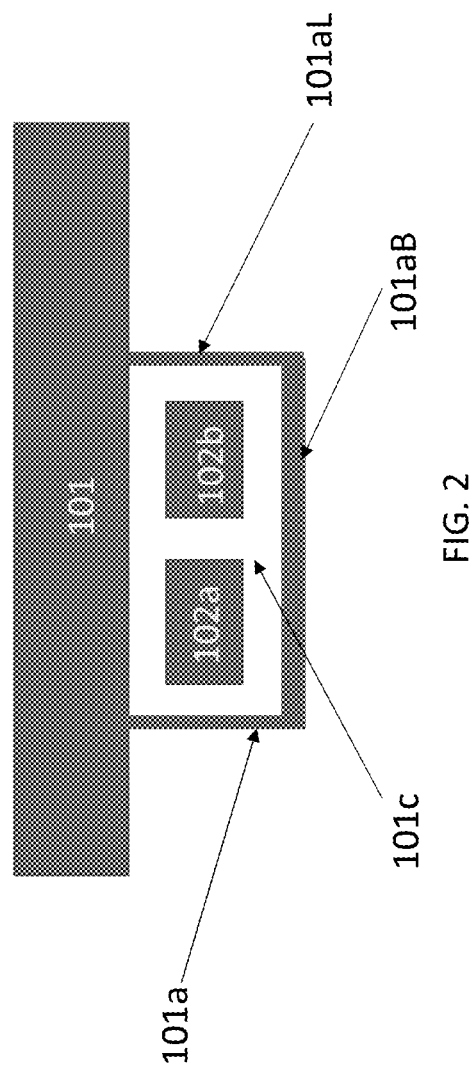
FIG. 2 illustrates a side view of an electrode structure on a circuit board according to one embodiment of present invention.

In one embodiment, as shown in FIG. 2, the first metal structure forms a first surface-mounted pad 101aB.

In one embodiment, the first metal structure forms a second surface-mounted pad.

In one embodiment, as shown in FIG. 2, wherein a plurality of electrical components 102a, 102b are disposed in the first space 101c.

In one embodiment, as shown in FIG. 2, lateral surfaces 101aL of the first metal structure 101a comprises a closed metal path.

In one embodiment, the first metal structure 101a has a through opening on a lateral side of the first metal structure 101a.

In one embodiment, lateral surfaces of the second metal structure 101b comprises a closed metal path.

In one embodiment, the second metal structure 101b has a through opening on a lateral side of the second metal structure 101b.

Figure 3A:
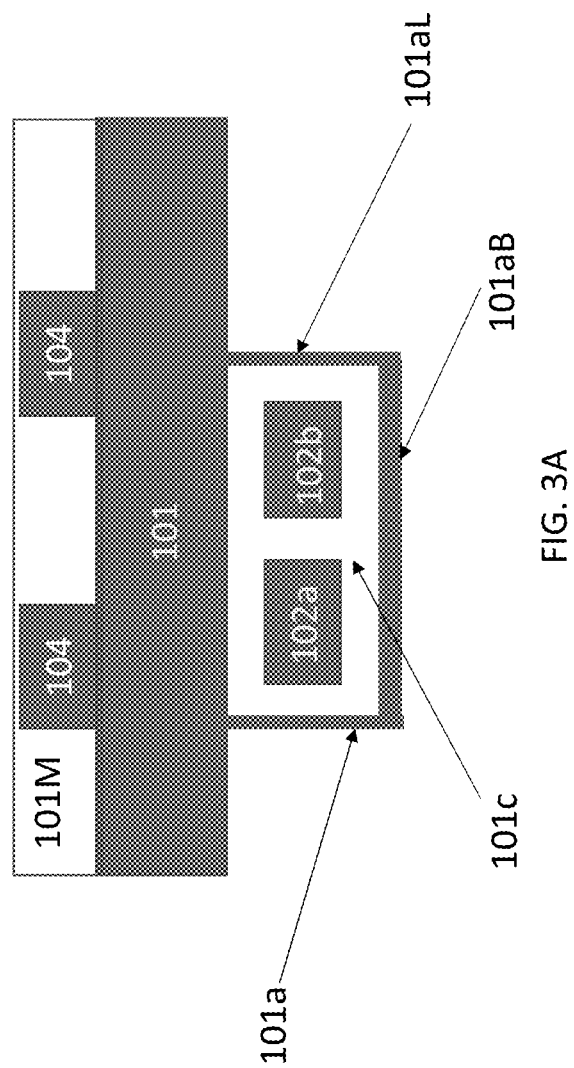
FIG. 3A illustrates a side view of a packaging structure with a molding body according to one embodiment of present invention.

In one embodiment, as shown in FIG. 3A, a molding body 101M encapsulates the electrical components disposed on the circuit board.

In one embodiment, as shown in FIG. 3B, a molding body 101M encapsulates the electrical components disposed on the circuit board and the circuit board.

In one embodiment, as shown in FIG. 3B, a molding body 101M encapsulates the electrical components disposed on the circuit board, the circuit board and a portion of the first metal structure.

The advantages of the present invention includes: 1. reducing the design area of circuit board and the cost of the circuit board; 2. reducing the thickness of the circuit board; 3. increasing the space available for the battery; 4. increasing the utilization space of the motherboard; 5. reducing the impact of the residual heat on the electrical components and the circuit board during spot-welding; 6. reducing the distance between the electrode and electrical components on the circuit board.

From the foregoing, it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. An electrode structure on a circuit board, said electrode structure comprising a first metal structure disposed on and electrically connected to the circuit board, wherein the first metal structure and a first surface of the circuit board forms a first space therebetween, wherein at least one first electrical component is disposed in said first space and an outer surface of the first metal structure forms a first electrode for electrically connecting with an external component, wherein said electrode structure further comprises a second metal structure disposed on and electrically connected to the circuit board, wherein the second metal structure and a second surface of the circuit board forms a second space therebetween, wherein at least one second electrical component is disposed in said second space and an outer surface of the second metal structure forms a second electrode for electrically connecting with said external component.

2. The electrode structure according to claim 1, wherein the external component is a battery and the first metal structure is electrically connected to a positive or a negative electrode of the battery.

3. The electrode structure according to claim 1, wherein the outer surface of the first metal structure comprises a first lateral surface and a bottom surface, wherein the outer surface of the first metal structure comprises a continuous metal path extending from the first lateral surface to the bottom surface, wherein the bottom surface covers the at least one first electrical component.

4. The electrode structure according to claim 3, wherein the outer surface of the first metal structure further comprises a second lateral surface opposite to the first lateral surface, wherein the continuous metal path extends from the first lateral surface to the second lateral surface via the bottom surface.

5. The electrode structure according to claim 1, wherein the metal structure comprises copper.

6. The electrode structure according to claim 5, wherein the first metal structure comprises a copper layer and a tin layer overlaid on the copper layer.

7. The electrode structure according to claim 1, wherein the first surface of the circuit board is a bottom surface of the circuit board.

8. The electrode structure according to claim 1, wherein the metal structure is soldered to the circuit board.

9. The electrode structure according to claim 1, wherein the at least one electrical component comprises at least one of the following: a resistor, a capacitor and an inductor.

10. The electrode structure according to claim 1, wherein the at least one electrical component comprises an active device and a passive device.

11. The electrode structure according to claim 1, wherein the external component is a battery, and the first metal structure and the second metal structure are electrically connected to a positive electrode and a negative electrode of the battery, respectively.

12. The electrical component according to claim 1, wherein the first metal structure forms a first surface-mounted pad.

13. The electrical component according to claim 12, wherein the second metal structure forms a second surface-mounted pad.

14. The electrical component according to claim 1, wherein lateral surfaces of the first metal structure comprises a closed metal path.

15. The electrical component according to claim 1, wherein lateral surfaces of the second metal structure comprises a closed metal path.

16. The electrical component according to claim 1, wherein a molding body encapsulates the electrical components disposed on the circuit board.

17. The electrical component according to claim 1, wherein a molding body encapsulates the electrical components on the circuit board and at least one portion of the circuit board.

18. The electrical component according to claim 1, wherein a molding body encapsulates the electrical components disposed on the circuit board, the circuit board and a portion of the first metal structure.

19. An electrode structure on a circuit board, said electrode structure comprising a first metal structure disposed on and electrically connected to the circuit board, wherein the first metal structure and a first surface of the circuit board forms a first space therebetween, wherein at least one first electrical component is disposed in said first space and an outer surface of the first metal structure forms a first electrode for electrically connecting with an external component, wherein the first metal structure comprises a copper layer, a nickel layer overlaid on the copper layer, and an aluminum layer overlaid on the nickel layer.

* * * * *